United States Patent
Rolandi et al.

[11] Patent Number: 5,999,445
[45] Date of Patent: Dec. 7, 1999

[54] MULTILEVEL NON-VOLATILE MEMORY DEVICES

[75] Inventors: Paolo Rolandi, Voghera; Cristiano Calligaro, Torre Isola; Alessandro Manstretta, Broni; Guido Torelli, Alessio Con Vialone, all of Italy

[73] Assignee: SGS-Thomson Microelectronics S.r.l., Agrate Brianza, Italy

[21] Appl. No.: 08/916,874

[22] Filed: Aug. 22, 1997

[30] Foreign Application Priority Data

Aug. 22, 1996 [EP] European Pat. Off. .............. 96830455

[51] Int. Cl.$^6$ .................................................. G11C 11/34
[52] U.S. Cl. .............................. 365/185.03; 365/185.22; 365/189.07
[58] Field of Search ......................... 365/185.03, 185.22, 365/189.07

[56] References Cited

U.S. PATENT DOCUMENTS

| | | | |
|---|---|---|---|
| 5,262,984 | 11/1993 | Noguchi et al. .................... | 365/185 |
| 5,638,323 | 6/1997 | Itano .................................... | 365/185.22 |
| 5,721,701 | 2/1998 | Ikebe et al. ......................... | 365/185.03 |
| 5,796,625 | 8/1998 | Takeshima et al. ................ | 365/185.03 |

FOREIGN PATENT DOCUMENTS

| | | |
|---|---|---|
| 0 214 451 | 3/1987 | European Pat. Off. . |
| 0 561 271 | 9/1993 | European Pat. Off. . |
| 0 591 690 | 4/1994 | European Pat. Off. . |

*Primary Examiner*—David Nelms
*Assistant Examiner*—Tuan T. Nguyen
*Attorney, Agent, or Firm*—Jenkens & Gilchrist PC

[57] ABSTRACT

In a storage device of the multi-level type, comprising a plurality of memory cells addressable through an address input each cell being adapted for storing more than one binary information element in a MOS transistor which has a control gate, and a floating gate for storing electrons to modify the threshold voltage of the transistor, and comprising a circuit enabling a Direct Memory Access (DMA) mode for directly accessing the memory cells from outside the device, the memory cells are programmed in the direct memory access mode by controlling, from outside the device, the amount of charge stored into the floating gate of each transistor.

19 Claims, 4 Drawing Sheets

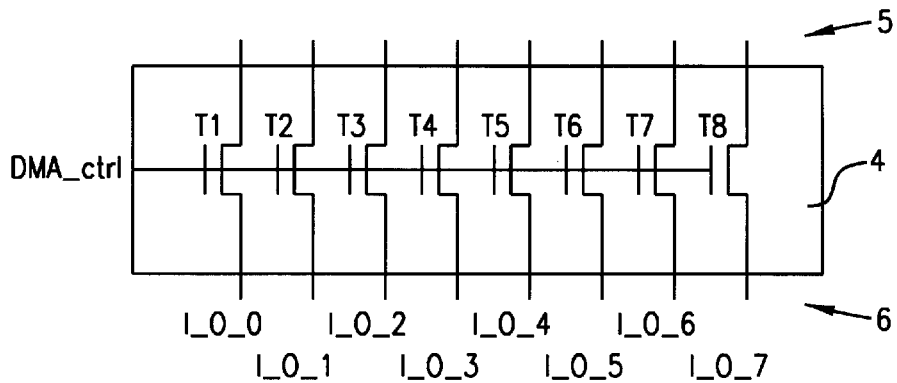
FIG.3
| | CE | OE | Vpp | AX | DMA_ctrl | SA_dis | Vg_ctrl |
|---|---|---|---|---|---|---|---|
| DMA write | 1 | 1 | H | H | 1 | 1 | 1 |
| DMA read | 0 | 1 | H | H | 1 | 1 | 0 |
| DMA disable1 | 0 | 0 | H | H | 0 | 1 | 0 |
| DMA disable2 | 1 | 0 | H | H | 0 | 1 | 0 |
FIG.4
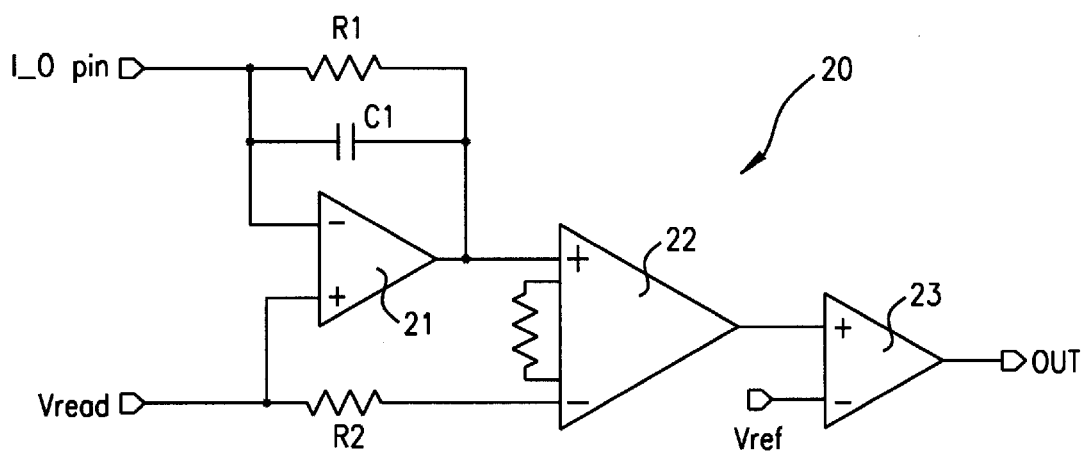
FIG.5

MULTILEVEL NON-VOLATILE MEMORY DEVICES

FIELD OF THE INVENTION

This invention relates to a multi-level storage device, i.e., a storage device which includes memory cells of the non-volatile type, each adapted for storing more than one binary element of information.

BACKGROUND OF THE INVENTION

The evolution of technological processes and the ever-increasing complexity of electronic systems are establishing a demand for very high density, non-volatile semiconductor memories (multi-megabit memories). The state of the art provides so-called multi-level memories wherein each memory cell is used for storing more than one information bit.

EPROM, EEPROM and FLASH EEPROM cells can be programmed by fine control of the charge injected to the floating gate so as to obtain a range of threshold voltages, as disclosed in U.S. Pat. No. 4,964,079 entitled "Electrically Programmable Memory with Several Information Bits Per Cell" to Jean Devin, SGS-THOMSON MICROELECTRONICS. A non-volatile cell with four threshold voltages, for example, can store two bits, while a cell with 16 different threshold values can store as many as four bits. For a given area, therefore, a device with multi-level memory cells can contain two or four times as much information. In fact, in non-volatile memories, the cell array forms a major portion of the device.

Several references have shown that non-volatile memories with two bits per cell, i.e., four levels of memories, are a practical possibility. One example is offered by T. S. Jung et al., "A 3.3V 128 Mb Multi-Level NAND Flash Memory for Mass Storage Applications", Proc. IEEE Int. Solid-State Circuits Conf., 1996, pages 32–33.

A current trend is toward providing a larger number of levels, such as, sixteen levels or even a full byte per cell. For an effective memory organization, it is better if an even number of bits can be stored in each cell.

To implement an increased number of levels per cell, such as sixteen or as many as 256 levels, far more stringent requirements must be met than those for conventional two-level memories. These requirements involve both technological and reliability aspects, such as the distribution of the threshold voltages, retention over time, and immunity to read/program disturbance, and design aspects, such as special read and program architectures.

For a given technology, the design aspects are most definitely critical, in that the design aspects actually impose restrictions on the maximum number of levels that can be stored and read reliably. In particular, it has been shown that the threshold voltage distribution width of a non-volatile cell is heavily dependent on the program algorithm. Accordingly, the allocation of a larger number of levels than four to a predetermined voltage (or current) window is limited to a large extent by the program circuitry.

Program algorithms are usually on-chip implementations, whereby the storage circuit can be programmed by the user on suitable programming equipment, such as EPROM programmers. In addition, to have the cells programmed accurately, it is best if an adaptive algorithm can be used in which each word cell is programmed and verified separately.

The design difficulties to be addressed in implementing circuitry for on-chip adaptive multi-level programming, i.e., a fully integrated circuitry, are considerable, especially in programming cells with 16-plus levels in any reliable manner.

Multiple levels ROMs (Read Only Memories) have also been developed which utilize special memory cells and appropriate multi-level reading arrangements. All such memories are, as is normal with ROMs, factory-programmed by the maker of the storage device and cannot later be modified by the user. The threshold voltage of the individual cells is varied at the masking stage of the ROM by controlling the amount of charge implanted in the channel regions. It will be appreciated that this can only be accomplished by introducing some additional process steps in the device fabrication cycle, which entails increased complexity and manufacturing costs.

The underlying technical problem of this invention is to provide an OTP (One-Time Programmable) EPROM storage device which is non-erasable and intended for read-only applications, has a very high integration density, and exhibits such constructional and functional features as to allow of programming with a large number of levels per cell, thereby to overcome the aforementioned limitations from the state of the art.

SUMMARY OF THE INVENTION

This invention solves the problem of providing very high density OTP-EPROMs, to draw full benefits from the use of multi-level cells.

This invention is based, on the one side, on the multiple levels principle, and on the other side, on the principle of factory-programming cell arrays. In fact, data are written into the memory by its manufacturer at the device testing stage prior to delivery to the end user.

The memory cells are programmed in the DMA (Direct Memory Access) mode by controlling, with high accuracy externally of the device, the amount of charge stored into the individual cells. This solution affords a much expanded multi-level range, including sixteen to 256 levels. Based on this solution, the technical problem is solved by a multi-level type of storage device as indicated above.

The technical problem is also solved by a writing method as indicated above.

The features of this invention will be more clearly apparent from the following detailed description of embodiments thereof illustrated, by way of example only, in the accompanying drawings.

BRIEF DESCRIPTION OF THE DRAWINGS

FIG. 3 illustrates an embodiment of a shunt circuit incorporated to the device of FIG. 1.

FIG. 4 is a table showing four possible DMA mode states of the device in FIG. 1.

FIG. 5 is a diagram of a reading circuit, external of the device in FIG. 1, used at the programming stage.

DETAILED DESCRIPTION OF A PREFERRED EMBODIMENT OF THE INVENTION

The present invention generally allows an n-bit information element to be stored into and read from a memory cell of the non-volatile type. This is obtained by electrically modifying the channel conductivity, and hence the threshold voltage, of a floating gate MOS transistor with a varying amount of charge stored in its floating gate. To store n bits into a memory cell, the threshold voltage should be able to take $2^n$ different values.

Figure 1:
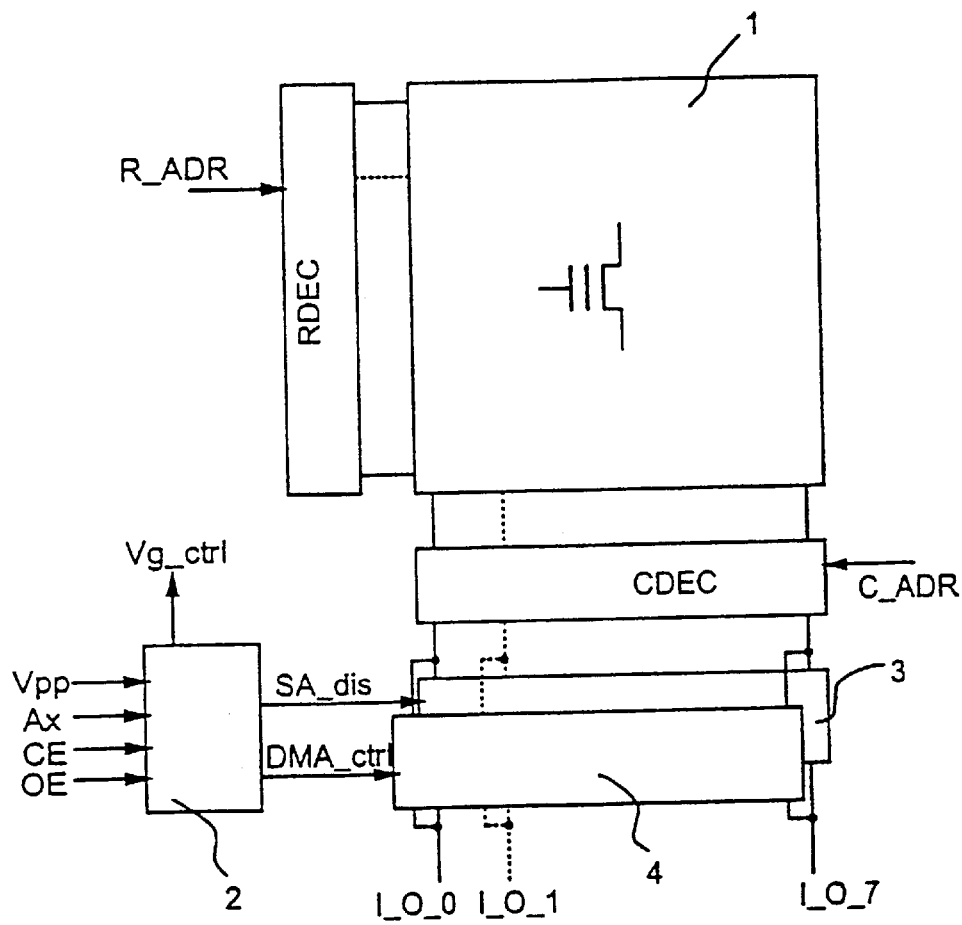
FIG. 1 is a block diagram of a multi-level storage device embodying this invention.

FIG. 1 shows a block diagram of a multi-level storage device which embodies this invention. The architecture of FIG. 1 includes a matrix 1 of memory cells (not individually shown) organized into rows and columns. The cells each comprise a floating-gate MOS transistor located at the intersections of rows with columns. The source terminals of all these transistors are connected to a common electric ground line; the drain terminals of transistors in one column are connected to a corresponding common column line, or bit line; and the gate terminals of transistors in one row are connected to a corresponding common row line, or word line.

A row decoder RDEC is input a row address R_ADR, and enables the selection of a given row, while a column decoder CDEC receives a column address C_ADR and enables the selection of a given column.

The decoder CDEC is connected, on the one side, to the columns in the matrix 1, and on the other side, to a read circuit block 3 which physically performs the multi-level reading operations and converts the information contained in the individual cells to binary data, which are then output on the device terminals I_O_0, I_O_1, . . . , I_O_7.

One example of a multi-level reading circuit capable of discriminating among as many as sixteen different levels is described in European Patent Application No. 95830347.1, filed on Jun. 31, 1995 by this Applicant. A reading method, and a circuit therefor, are described in that Application which use a mixed dichotomic-serial and parallel reading arrangement. A memory cell is read in successive steps; at each step, a comparison is carried out in parallel of the cell current with a plurality of reference currents. The reference currents are selected such that the range of possible cell currents is divided into several sub-ranges. This step is iterated to effect a parallel comparison of the cell currents with the threshold currents contained in the sub-range defined during a previous step. The cell reading is completed when the last sub-range selected contains a single threshold current.

A DMA mode enable circuit 2 controls the storage device of FIG. 1. In the DMA mode, the selected memory cells can be accessed directly (via the bit lines) through the terminals I_O_0, I_O_1, . . . , I_O_7 from outside the device.

The circuit 2 has four input terminals, where signals Vpp, Ax, CE and OE are respectively received, and three output terminals. A first output terminal, designated SA_dis, enables or disables the read circuit block 3. A second output terminal DMA ctrl enables/disables a shunt block 4 used for bypassing the read block 3. The third output terminal Vg_ctrl controls, through standard supply circuits as employed with non-volatile memories, the voltage being applied to the gate terminals of the memory cells. Normally Vpp=12volts during the programming step, or Vcc=5volts during the reading step.

The signal Vpp is the standard voltage Vpp as used for programming memories of this type, which is usually twelve volts. The signal Ax issues from one of the address terminals of the memory A0-An, e.g., terminal A4, and is used, together with the signal Vpp, to enable operation in the DMA mode. The signals CE and OE are the Chip Enable and Output Enable signals used to differentiate the several operational states in the DMA mode.

Figure 2:
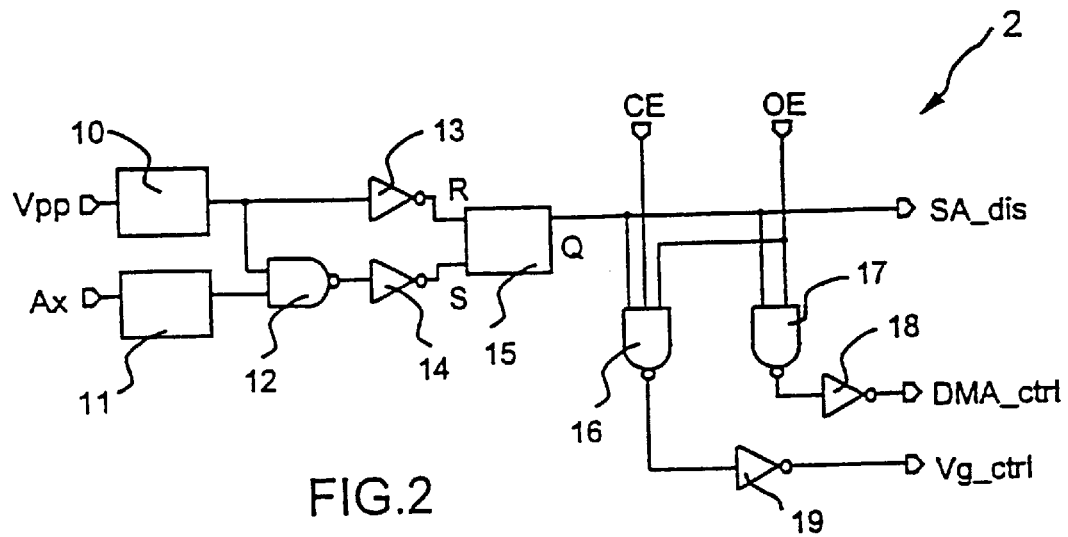
FIG. 2 illustrates an embodiment of a DMA-mode control circuit incorporated to the device of FIG. 1.

The enable circuit 2 is shown in greater detail in FIG. 2. The signals Vpp and Ax are input to sense blocks 10 and 11, respectively, for a third logic level H. These blocks 10 and 11 are used to sense a third logic level, which may correspond to a twelve-volt voltage, on the input signals Vpp and Ax. The output of these blocks is at a logic level 1 when the input signal voltage is higher than a predetermined threshold level intermediate to the logic level 1 and the third level H.

The outputs of the blocks 10 and 11 are coupled, through logic gates 12, 13 and 14, to the inputs SET and RESET of a flip-flop 15 of the SR type such that the flip-flop will be set, with both signals Vpp and Ax at the third logic level, and reset as the signal Vpp decreases.

The output Q of the flip-flop 15 is connected to the output SA_dis as well as to two first inputs of two NAND gates 16 and 17. A second input of the gate 16 receives the signal CE, while a third input, together with a second input of the gate 17, receives the signal OE. The output of the gate 17 supplies, through an inverter 18, the output signal DMA_ctrl, and the output of the gate 16 supplies the signal Vg_ctrl through an inverter 19.

FIG. 3 shows in detail the shunt block 4, as arranged in parallel with the reading circuit block 3 and controlled by the signal DMA_ctrl. This block has a first set of terminals, collectively designated 5, which are connected to corresponding terminals of the read block 3, and a second set of terminals, collectively designated 6, which are connected to the output terminals I_O_0, . . . , I_O_7 of the read block.

The shunt block 4 comprises eight transistors, labeled T1, . . . , T8, of the MOS type, each with a conduction path lying between one terminal of the first set 5 and a terminal of the second set 6. The transistors T1, . . . , T8 have control terminals connected together and to the input receiving the signal DMA_ctrl.

The table in FIG. 4 illustrates four different operational states of the device 1 in the DMA mode. In particular, the logic levels of the three output signals DMA_ctrl, SA_dis and Vg_ctrl are specified as the four input signals CE, OE, Vpp and Ax vary.

The logic levels of 0 and 1 correspond to voltages normally employed to power storage devices, i.e. zero volts for the level 0, and five volts for the level 1, while the level H corresponds to a higher voltage, such as the voltage Vpp=twelve volts used for programming:

Level 0: 0 volts

Level 1: 5 volts

Level H: 12 volts.

The signals Vpp and Ax, when brought to the third level H, enable the DMA mode of operation, while the signals CE and OE are used to discriminate among the four different ways of operating in the DMA mode.

In particular, with CE=1 and OE=1, the DMA write mode will be enabled; in fact, the signal DMA_ctrl is high to enable the shunt block 4, the signal SA_dis is high to disable the read circuit 3, and the signal Vg_ctrl is high to provide a program voltage of 12 volts on the gate terminals of the selected cells.

The second line of the table corresponds to a DMA read mode situation, with CE=0 and OE=1. The signal DMA_ctrl is high to enable the shunt block 4, the signal SA_dis is high to disable the read circuit 3, and the signal Vg_ctrl is low to remove the program voltage from the gate terminals of the selected cells.

The operational states that correspond to the third and fourth lines of the table are two disable states which are used as intermediate states to change from the read state to the write state, and vice versa. In either state, in fact, the shunt block 4 and read block 3 are both disabled by the signals DMA_ctrl and SA_dis.

FIG. 5 shows a DMA mode read circuit 20 used in programming the memory cells. The circuit 20 is external of the storage device in FIG. 1, and is exemplary of an adequately accurate circuit for sensing a cell current and comparing it with a reference value. The circuit 20 comprises an operational amplifier 21 having a non-inverting (+) input which is applied a read voltage Vread of about one volt, and an inverting (−) input which is connected to an output terminal I_O_n of the device during a read operation. These DMA mode terminals are connected, by means of the shunt block 4, directly to the selected columns in the matrix, and therefore, to the drain terminals of the memory cells. The operational amplifier 21 is fed back by a resistor R1 and a compensation capacitor C1.

The output of the amplifier 21 is connected to an input of a differential amplifier 22, having a second input coupled to the read voltage Vread through a resistor R2. The amplifier 22 has an amplification factor of 2.5, and outputs a voltage which is proportional to the current of the memory cell being read. This voltage is input to a comparator 23, which will compare it with a reference value Vref and output a signal OUT. Thus, the circuit 20 allows the cell current to be very accurately compared with a reference Vref, thereby determining when the cell programming is completed.

In fact, by setting a reference value Vref which is proportional to the threshold voltage level to be set for a cell being programmed, iterative read/verify steps will allow the threshold voltage of the cell to be brought to the desired value with great accuracy.

Figure 6:
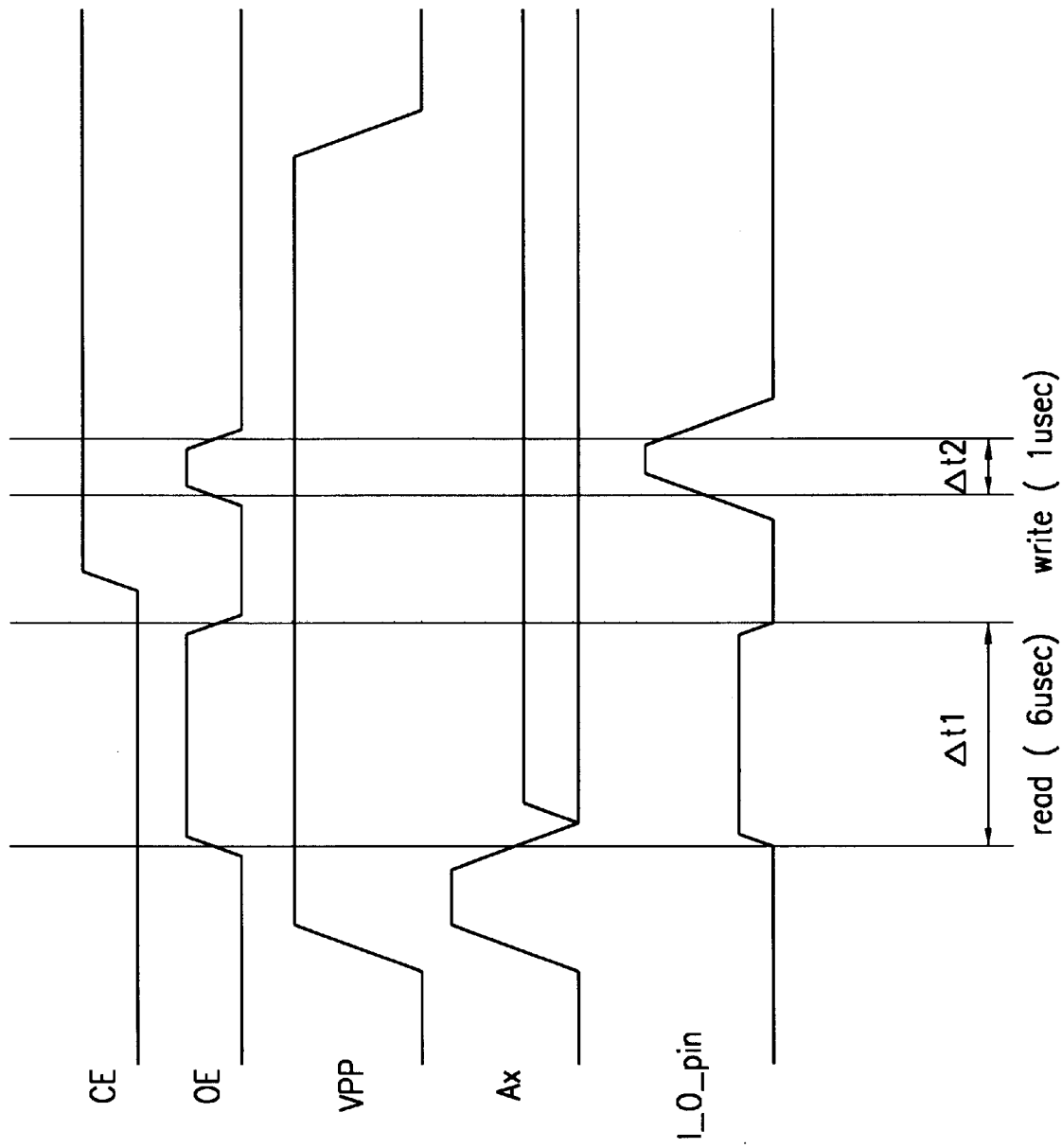
FIG. 6 shows the waveforms of certain signals to appear in the device of FIG. 1 during read/write operations.

FIG. 6 shows the waveforms vs. time of the signals CE, OE, Vpp, Ax and the output terminal I_O_pin, during the read and write steps in the DMA mode as used in programming. As can be gathered from the figure, the signals Vpp and Ax are initially brought to the third logic level H to enable the DMA mode; thereafter, Vpp is held high while Ax is used as the normal address signal. A read voltage Vread of one volt, during the read step, and a program voltage of six volts, during the write step, are forced to the output terminal I_O_pin. Also shown are the two intermediate disable states between reading and writing, whereat CE=0, OE=0 and CE=1, OE=0.

The method of programming a storage device embodying this invention will now be described.

The writing method comprises the steps of:
a) enabling the DMA mode by means of the enable signals Vpp and Ax;
b) selecting a cell or group of cells by delivering a read address to the column decoder CDEC and the row decoder RDEC;
C) sensing the conductivity of the channel region of the transistor associated with the selected cell by reading the drain current of the cell;
d) comparing that conductivity with a predetermined proportional value to the input information;
e) if the conductivity is higher than said predetermined value, applying a program voltage to the drain terminal of the cell, from outside the device and for a predetermined finite time;
f) repeating steps c) to e) until the conductivity of the transistor channel region shows to be the equal of said predetermined value.

Figure 7:
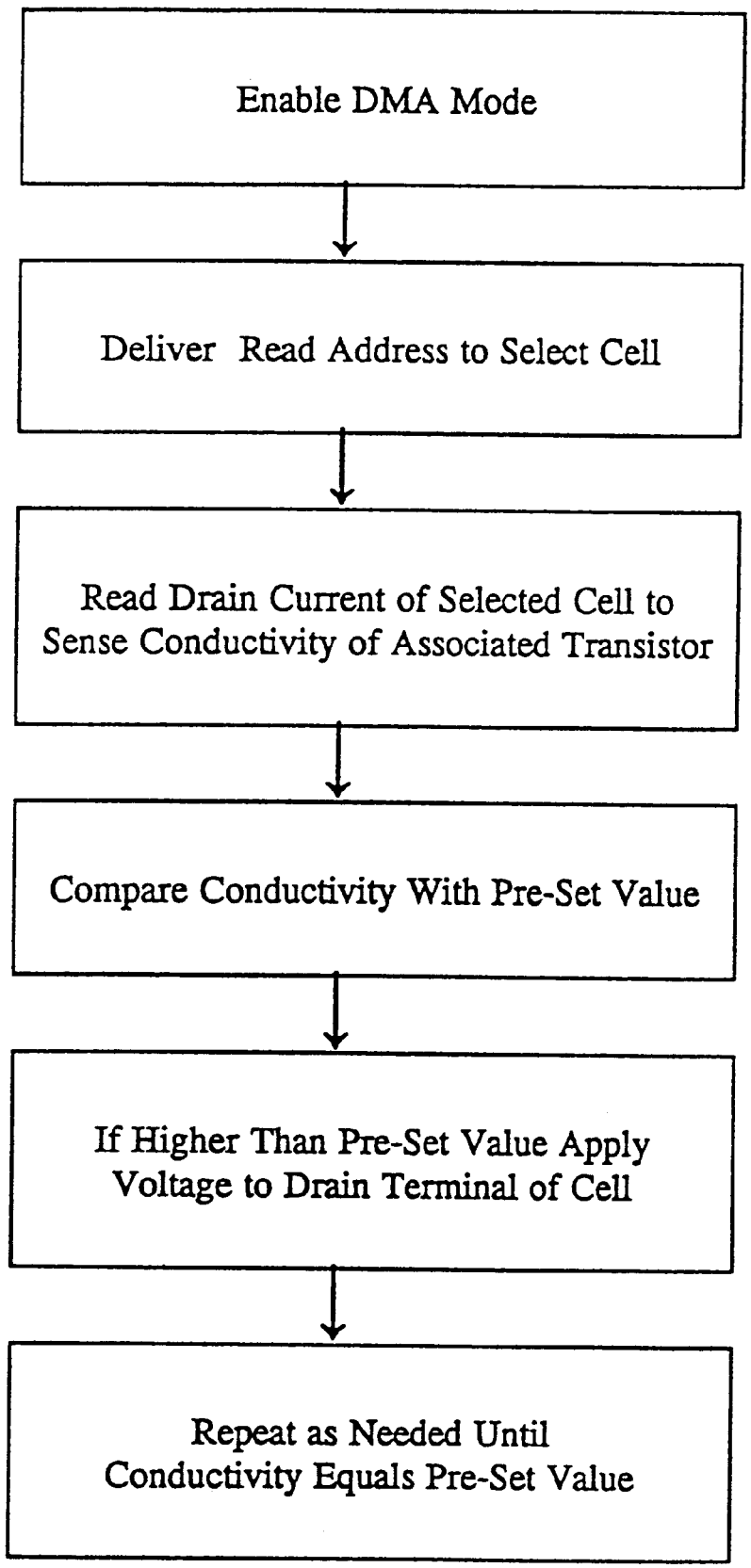
FIG. 7 is a flow chart illustrating the operation of the present invention.

The method is summarized in FIG. 7.

Programming is to be carried out at the factory, using a multi-level master programmer of high accuracy, by the maker of the integrated circuit. An essential feature of the device is, in fact, that the memory cells can be accessed directly from outside the device. The multi-level master programmer can, therefore, be designed to very high sensitivity specifications for the control parameter (threshold voltage or drain current) and the program algorithm, with none of the area restrictions which affect program circuits integrated to EEPROM storage devices.

For example, the master programmer may incorporate a cell drain-current sensing circuit such as that shown in FIG. 5 and previously described. Using this circuit, the drain current can be controlled with an accuracy of 1 $\mu$A, which is equivalent to providing a cell distribution of 2 $\mu$A. This accuracy is adequate to permit sixteen levels, being the equivalent of four information bits, to be written and read with certainty into/from each memory cell.

It should be understood that, by using a programmer of still higher accuracy, this storage device could be programmed with an even larger number of levels per cell, e.g., 256 levels corresponding to 8 bits per cell.

The table below shows a classification of multi-level non-volatile memories for read-only applications according to the technique employed in their programming. It specifies the location of the storage devices embodying this invention, referred to herein as OTP-MEPROMs (One Time Programmable Multi-level EPROMs), that form the subject matter of the present patent.

| Memory Type | Program | Read |
| --- | --- | --- |
| ROM | Mask-programmed | On chip |
| EPROM, OTP-EPROM | On chip (User-prog) | On chip |
| OTP-MEPROM | Factory-programmed | On chip |

Thus, the solution herein makes these memories (OTP-MEPROM) highly preferable to multi-level ROMs for a given storage density and addresses the market of very high capacity, read-only mass storage systems (for audio storage, catalog, data base, digital video decode, cellular phone, digital map storage in GPS apparatus, and the like applications).

The implementation of this solution opens a new applicational field for EPROMs, either alternatively to multi-level ROMs or to user-programmed OTP-EPROMs. Very high density, multi-level OTP-MEPROMs can now be used for read-only memory applications, similarly to ROMs, since they can be factory-programmed just as ROMs are.

Accurate control of the charge injected to the floating gate can be readily achieved by programming the memories at a final testing step. During this step, the individual devices are normally connected to test equipment adapted to perform write and read operations on all the memory cells in order to have the cells tested individually for integrity. Thus, during this step, it will be easy and economical to have the memory cells accessed in the DMA mode by an industrial-type programmer of high precision, and control with sufficient accuracy the amount of charge being injected to each cell.

It is to be expected, therefore, that factory-programmed, very high density multi-level OTP-MEPROMs soon will be used in preference of mask-programmed, multi-level ROMs. In fact, programming is now performed on floating-gate cells to achieve improved ratio of program accuracy to cost compared to multi-level ROMs, which are conventionally programmed by the definition of additional technological steps (masking, implantation, etc.).

The foregoing invention has been described in some detail with regard to certain embodiments. The scope of the invention, however, is limited only by the following claims.

What is claimed is:

1. A storage device of a multi-level type, comprising:

a plurality of memory cells addressable through at least one address input, each memory cell being adapted for storing more than one binary information element in a MOS transistor of the memory cell which has a channel region connected between first and second terminals, a control gate, and a floating gate for storing electrons in order to modify a threshold voltage of the MOS transistor and to control conductivity of the channel region of the MOS transistor;

an enable circuit enabling a Direct Memory Access (DMA) mode for directly accessing at least one of said first and second terminals from outside the storage device;

wherein the plurality of memory cells are programmed in the direct memory access mode by controlling, from outside the storage device, the amount of charge stored into the floating gate of the MOS transistor of each memory cell.

2. The storage device according to claim 1, wherein said direct memory access mode is activated from outside the storage device through control inputs of the enable circuit receiving control signals.

3. The storage device according to claim 2, wherein first and second control signals enable the direct memory access mode, and third and fourth control signals discriminate among different steps of the direct memory access mode.

4. A method of writing a set of information elements into a storage device of a multi-level type comprising a plurality of memory cells addressable through at least one address input, each memory cell being adapted for storing more than one binary information element in a MOS transistor thereof which has a floating gate for storing electrons in order to modify a threshold voltage of the MOS transistor and to control conductivity of the channel region of the MOS transistor, and a circuit enabling a Direct Memory Access (DMA) mode having at least one enable input, the method comprising the steps of:

enabling the DMA mode through said at least one enable input;

selecting a memory cell or group of memory cells by delivering a read address to said at least one address input; and modifying the conductivity of the channel region of the MOS transistor associated with the selected memory cell by storing, into the floating gate of the MOS transistor of the selected memory cell, an amount of electrons proportional to a predetermined information element, the step of storing including the step of accessing at least one terminal of the MOS transistor of the selected memory cell directly from outside the storage device.

5. The writing method according to claim 4, wherein the step of modifying further comprises the steps of:

sensing the conductivity of the channel region of the MOS transistor associated with the selected memory cell;

comparing said conductivity of the channel region of the MOS transistor with a predetermined value proportional to the predetermined information element;

if the conductivity of the channel region of the MOS transistor is higher than said predetermined value, applying a program voltage to said at least one terminal of the MOS transistor of the selected memory cell, from outside the storage device and for a predetermined finite period of time; and repeating the steps of sensing, comparing and applying a program voltage until the conductivity of the channel region of the MOS transistor shows to be equal to said predetermined value.

6. The storage device according to claim 3, wherein:

the enable circuit includes sensing circuits for sensing voltage levels of the first and second control signals.

7. The storage device according to claim 6, wherein:

the enable circuit includes a storage element which is responsive to the sensing circuits.

8. The storage device according to claim 1, further including:

a direct memory access read circuit for comparing a current level in a selected memory cell to a predetermined value.

9. The storage device according to claim 8, wherein the direct memory access read circuit comprises:

amplifying circuitry, responsive to the current level in the selected memory cell; and comparing circuitry, responsive to an output of the amplifying circuitry and to the predetermined value, for generating a signal indicative of a level of accuracy of the threshold voltage of the MOS transistor of the selected memory cell to a desired threshold voltage level.

10. The storage device of claim 9, wherein:

the predetermined value of the comparing circuitry is settable to correspond to any desired threshold voltage level for the MOS transistor of the selected memory cell to be programmed.

11. The storage device of claim 2, wherein:

the enable circuit includes circuitry for selectively disabling a read circuit of the storage device when the control inputs of the enable circuit are configured in a direct memory access mode.

12. The storage device of claim 2, further including:

bypassing circuitry, responsive to an output of the enable circuit, for selectively bypassing read circuitry of the storage device, to provide direct access to the selected memory cell externally to the storage device.

13. The writing method according to claim 4, wherein the step of modifying comprises the steps of:

sensing the conductivity of the channel region of the MOS transistor associated with the selected memory cell;

comparing said conductivity with a predetermined value proportional to the predetermined information element; and applying a program voltage to said at least one terminal of the MOS transistor of the selected memory cell from outside the storage device for a predetermined finite period of time upon an affirmative determination that the conductivity of the channel region of the MOS transistor of the selected memory cell does not match said predetermined value.

14. The writing method according to claim 13, wherein:

the program voltage is applied to said at least one terminal of the MOS transistor of the selected memory cell upon the affirmative determination that the conductivity of the channel region of MOS transistor of the selected memory cell is greater than said predetermined value.

15. The writing method according to claim 4, further comprising the step of:

enabling a direct memory access read mode operation prior to the step of selecting.

16. The writing method according to claim 5, further comprising the step of:

enabling a direct memory access write mode operation prior to the step of applying a program voltage.

17. The writing method according to claim 5, wherein:

the step of sensing includes the step of bypassing read circuitry included in the storage device.

18. The writing method according to claim 5, wherein: the step of applying a program voltage includes the step of bypassing read circuitry included in the storage device.

19. The writing method according to claim 4, further comprising the step of:

disabling read circuitry included in the storage device.

* * * * *